US008581589B2

(12) United States Patent
Wald et al.

(10) Patent No.: US 8,581,589 B2
(45) Date of Patent: Nov. 12, 2013

(54) SYSTEM AND METHOD FOR VARIABLE MODE-MIXING IN MAGNETIC RESONANCE IMAGING

(75) Inventors: Lawrence L. Wald, Cambridge, MA (US); Vijayanand Alagappan, Streetsboro, OH (US); Jonathan R. Polimeni, Cambridge, MA (US)

(73) Assignee: The General Hospital Corporation, Boston, MA (US)

(*) Notice: Subject to any disclaimer, the term of this patent is extended or adjusted under 35 U.S.C. 154(b) by 821 days.

(21) Appl. No.: 12/698,864

(22) Filed: Feb. 2, 2010

(65) Prior Publication Data

US 2010/0289494 A1 Nov. 18, 2010

Related U.S. Application Data

(60) Provisional application No. 61/149,103, filed on Feb. 2, 2009.

(51) Int. Cl.
*G01R 33/3415* (2006.01)
*G01R 33/36* (2006.01)

(52) U.S. Cl.
USPC .......... 324/322; 324/318

(58) Field of Classification Search
USPC .......... 324/300–322; 702/19, 85; 600/407–435; 382/128–131
See application file for complete search history.

(56) References Cited

U.S. PATENT DOCUMENTS

| | | | | |
|---|---|---|---|---|
| 3,103,623 | A * | 9/1963 | Greenwood, Jr. | 324/302 |
| 3,250,986 | A * | 5/1966 | McKay | 324/303 |
| 3,387,195 | A * | 6/1968 | Piccand et al. | 318/800 |
| 3,443,208 | A * | 5/1969 | Ruddock et al. | 324/304 |
| 4,689,563 | A * | 8/1987 | Bottomley et al. | 324/309 |
| 4,694,254 | A * | 9/1987 | Vatis et al. | 324/309 |
| 5,568,400 | A * | 10/1996 | Stark et al. | 702/85 |
| 7,057,387 | B2 * | 6/2006 | Duensing et al. | 324/307 |
| 7,141,971 | B2 * | 11/2006 | Duensing et al. | 324/307 |
| 7,800,368 | B2 * | 9/2010 | Vaughan et al. | 324/318 |
| 7,847,554 | B2 * | 12/2010 | Nistler et al. | 324/318 |
| 2003/0038632 | A1 * | 2/2003 | Duensing et al. | 324/307 |
| 2004/0111220 | A1 * | 6/2004 | Ochs et al. | 702/19 |
| 2006/0055405 | A1 * | 3/2006 | Duensing et al. | 324/307 |
| 2007/0285096 | A1 * | 12/2007 | Soutome et al. | 324/318 |
| 2008/0129298 | A1 * | 6/2008 | Vaughan et al. | 324/322 |
| 2008/0284432 | A1 * | 11/2008 | Nistler et al. | 324/307 |
| 2010/0289494 | A1 * | 11/2010 | Wald et al. | 324/318 |

* cited by examiner

*Primary Examiner* — Melissa Koval
*Assistant Examiner* — Tiffany Fetzner
(74) *Attorney, Agent, or Firm* — Quarles & Brady LLP

(57) ABSTRACT

The present invention provides a system and method for using a hardware-based compression of signals acquired with an magnetic resonance imaging (MRI) system. This allows a first multi-channel MR signal to be compressed to a second multi-channel MR signal having fewer channels than the first MR signal. This system and method reduces the number of RF receivers needed to achieve the sensitivity encoding benefits associated with highly parallel detection in MRI. Furthermore, the system and method reduces bottlenecks connection an MRI system's RF receiver and reconstruction computer and reduces the computational burden of image reconstruction.

21 Claims, 4 Drawing Sheets

PATIENT POSITIONING SYSTEM
SCAN ROOM INTERFACE
RF SYSTEM
PHYSIOLOGICAL ACQUISITION CONTROLLER
GRADIENT SYSTEM
PULSE SEQUENCE SERVER
DATA ACQUISITION SERVER
DATA PROCESSING SERVER
DATA STORE SERVER
10
12
14
16
18
20
22
23
24
26
28
30
32
34
36
38
40
42
44

SYSTEM AND METHOD FOR VARIABLE MODE-MIXING IN MAGNETIC RESONANCE IMAGING

CROSS-REFERENCE TO RELATED APPLICATIONS

The present application is based on, claims priority to, and hereby incorporates by reference U.S. Provisional Patent Application Ser. No. 61/149,103, filed Feb. 2, 2009, and entitled "SYSTEM AND METHOD FOR MODE MIXING IN MRI."

STATEMENT REGARDING FEDERALLY SPONSORED RESEARCH

This invention was made with government support under Grant Nos. P41 RR14075 and R01 EB006847 awarded by the National Institute of Health. The United States Government has certain rights in this invention.

BACKGROUND OF THE INVENTION

The present invention relates generally to magnetic resonance imaging ("MRI") methods and systems and, more particularly, the invention relates to a system and method for the compression, in hardware, of acquired MR data.

When a substance such as human tissue is subjected to a uniform magnetic field (polarizing field $B_0$), the individual magnetic moments of the excited nuclei in the tissue attempt to align with this polarizing field, but presses about it in random order at their characteristic Larmor frequency. If the substance, or tissue, is subjected to a magnetic field (excitation field $B_1$) that is in the x-y plane and that is near the Larmor frequency, the net aligned moment, $M_Z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear" or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space as described, for example, in U.S. Pat. No. 6,954,067. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1 DFT of each radial projection view and then transforming the Radon space data set to image space by performing a filtered backprojection.

Depending on the technique used, many MR scans currently used to produce medical images require many minutes to acquire the necessary data. The reduction of this scan time is an important consideration, since reduced scan time increases patient throughout, improves patient comfort, and improves image quality by reducing motion artifacts. Many different strategies have been developed to shorten the scan time.

One such strategy is referred to generally as "parallel imaging". Parallel imaging techniques use spatial information from arrays of RF receiver coils to substitute for the encoding that would otherwise have to be obtained in a sequential fashion using RF pulses and field gradients (such as phase and frequency encoding). Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image (in comparison to conventional k-space data acquisition) by a factor that in the most favorable case equals the number of the receiver coils. Thus the use of multiple receiver coils acts to multiply imaging speed, without increasing gradient switching rates or RF power.

Two categories of such parallel imaging techniques that have been developed and applied to in vivo imaging are SENSE (SENSitivity Encoding) and SMASH (SiMultaneous Acquisition of Spatial Harmonics). With SENSE, the undersampled k-space data is first Fourier transformed to produce an aliased image from each coil, and then the aliased image signals are unfolded by a linear transformation of the superimposed pixel values. With SMASH, the omitted k-space lines are filled in or reconstructed prior to Fourier transformation, by constructing a weighted combination of neighboring lines acquired by the different receiver coils. SMASH requires that the spatial sensitivity of the coils be determined, and one way to do so is by "autocalibration" that entails the use of variable density k-space sampling.

A more recent advance to SMASH techniques using autocalibration is a technique known as GRAPPA (GeneRalized Autocalibrating Partially Parallel Acquisitions), introduced by Griswold et al. This technique is described in U.S. Pat. No. 6,841,998 as well as in the article titled "Generalized Autocalibrating Partially Parallel Acquisitions (GRAPPA)," by Griswold et al. and published in *Magnetic Resonance in Medicine* 47:1202-1210 (2002). Using these GRAPPA techniques, lines near the center of k-space are sampled at the Nyquist frequency (in comparison to the greater spaced lines at the edges of k-space). These so-called autocalibration signal (ACS) lines are then used to determine the weighting factors that are used to reconstruct the missing k-space lines. In particular, a linear combination of individual coil data is used to create the missing lines of k-space. The coefficients for the combination are determined by fitting the acquired data to the more highly sampled data near the center of k-space.

Large coil arrays, for example, coil arrays having 96 or more channels, provide improved sensitivity and increased acceleration capabilities. However, MR systems currently capable of using these large coil arrays, that is, MRI systems equipped with 96 or more receiver channels, are expensive and scarce. Furthermore, image reconstruction from so many channels of data is a computationally expensive process that is especially problematic for high-resolution and high-acceleration imaging, which are the type of applications for which large coil arrays are typically designed. Unaccelerated image reconstruction is readily parallelizable with one processor assigned to each channel followed by a simple combination method such as the pixel-by-pixel, "sum-of-squares" method. In contrast, the computational burden and difficulties in parallelizing reconstruction increase dramatically when a method, such as GRAPPA or SENSE, is used in which all of the multi-channel data is operated on simultaneously. With GRAPPA for example, the computation burden scales approximately as the cube of the number of channels. Therefore, the reconstruction of an accelerated 96-channel scan can easily take ten times longer than the reconstruction of an accelerated 32-channel scan. This is true even when using an expensive, high-end reconstruction computer, for example, a dual quad-core Opteron with 32 GB RAM running 64-bit Linux.

The data-rate limitation of the communication bus between a digital receiver and a reconstruction computer poses an additional problem when acquiring multi-channel MR data using large coil arrays. For example, the throughput limit of common bus technologies, such as PCI, is approached when performing a 128-channel scan with a fast pulse sequence, for example, a 2D 64×64 echo planar imaging (EPI) pulse sequence at 15 slices per second. Methods such as echo volumar imaging (EVI), which may use a 64×64×48 matrix at five volumes per second, can produce a 40-fold increase in data-throughput requirements that exceeds the limitations of common bus technologies.

The computational burden of image reconstruction can be reduced by employing a software-based compression scheme to compress multi-channel MR data prior to reconstruction. These software-based compression schemes may implement a technique known as mode-mixing, which decomposes and transforms multi-channel data so that the signal-to-noise ratio (SNR) is contained within a small subset of channels, allowing channels that contribute relatively little to SNR to be eliminated. For example, digital mode-mixing schemes employing eigen-decomposition of singular value decomposition (SVD) are often used to compress images without significant losses in image quality. These digital mode-mixing strategies provide reduced computational burden during image reconstruction and may be optimized for a given array. Moreover, digital mode-mixing strategies allow the computation of multiple mode-mixing matrices to optimize different acquisitions, for example, unaccelerated SNR or SNR in an accelerated image with different rates or different acceleration directions. However, digital mode-mixing strategies cannot reduce MRI system receiver channel requirements or the data bus bottleneck between the digital receiver and the reconstruction computer.

Hardware-based compression of acquired MR data has been provided for specific coil arrays. For example, a traditional hardware-based, mode-mixing strategy for compressing MR data utilizes degenerate birdcage coils. Unlike high-pass or low-pass birdcage coils, the modes of oscillation of a degenerate birdcage coil are resonant at the Larmor frequency and the spatial patterns of the birdcage modes are orthogonal. Therefore, decomposition is not needed to diagonalize the sensitivity correlation matrix. Furthermore, the spatial modes have very unequal weights. The commonly used "uniform mode" contains the most sensitivity while "gradient modes" contain a null in the center and a monotonic increasing sensitivity towards the periphery. Importantly, half the modes have the correct circular polarization for MR detection, so-called "CP modes," while the other modes, the "anti-CP modes," have the incorrect polarization and contribute no new information. Since the anti-CP modes contribute nothing, they can be excluded with little penalty, thereby allowing the benefits of a 2N-channel coil with N receivers.

It has been shown that typical head coil arrays having a single ring of loop coils on a cylindrical frame show this type of degenerative birdcage symmetry. A hardware implementation of the complete mode-mixing matrix needed for forming birdcage modes from a cylindrical ring of loop elements has recently been developed. Birdcage modes are formed by sending equal amplitude currents to each element around a cylindrical ring with a phase relationship that varies in uniform steps from zero to 2π for the uniform mode, from zero to 4π for the first gradient mode, and so forth. As a result, the mode-mixing matrix resembles a Fourier transform. This technique was implemented for radar using quadrature hybrids and phase shifters by Butler in 1961. This "Butler matrix" and mode truncation have recently been used to capture the majority of the benefit of a 7T 16-element stripline transmit array using an 8-channel parallel transmit array.

Siemens has implemented another hardware-based mode compression scheme in its total imaging matrix (TIM) RF system, which utilizes a reduced and local implementation of the birdcage basis set. In this system, data acquired by clusters of three coils is combined locally before being sent to the receivers. TIM is a registered trademark of Siemens Aktiengesellschaft of Germany. Groups of three adjacent coils are combing using a 3×3 mode-mixing matrix with fixed values, which utilizes the phase relationship that these elements would have if they formed a sub-section of a cylindrical ring and the first three birdcage modes were desired. Thus, the three loop coils are transformed into a local approximation of the birdcage modes. These modes include the "primary mode," or CP-mode, in which the loops are added with the phase relation of the uniform birdcage mode; the "secondary mode" which utilizes the phases of the first gradient mode; and the anti-CP mode. To the extent that the cylindrical birdcage symmetry holds, the primary mode contains most of the sensitivity while the secondary mode holds some sensitivity near the periphery, and the anti-CP mode contributes relatively little. Therefore, if a large coil array is used with an instrument having a reduced number of receivers or if faster reconstruction is desired, only the primary mode or the primary and secondary modes are connected to the receivers.

While highly advantageous for specific coil arrays, such as cylindrically symmetric birdcage coils, traditional hardware-based mode-mixing strategies are more limited for general coil arrays. For example, the Butler matrix combination is inapplicable when coils are distributed along the direction of the principal magnetic field ($B_0$). These limitations ultimately prevent the use of hardware-based MR data compression for a wide variety of applications. Furthermore, software-based mode-mixing strategies cannot reduce receiver channel requirements in MRI systems or data bottlenecks on the bus that conveys acquired scan data to an image reconstruction computer It would therefore be desirable to develop a system and method for mode-mixing that reduces RF receiver requirements for MRI scanners, data bus bottlenecks, and the computational burden of image reconstruction.

SUMMARY OF THE INVENTION

The present invention overcomes the aforementioned drawbacks by providing an RF system for use in a magnetic resonance imaging (MRI) system that includes hardware-based compression of MR signals, yet is capable of being utilized with a variety of array coils. In particular, system and method is provided for reducing the number of RF receivers needed to achieve the sensitivity and encoding benefits associated with highly parallel detection in MRI. A new direction in "mode-mixing" methodology is provided where the high sensitivity and spatial encoding information is extracted from large arrays using a minimum number of receiver channels. In analogy to an SVD-based image compression scheme, a conventional "basis set" of sensitivity patterns is transformed in hardware to a linear combination of array elements with spatially orthogonal properties. Ranking the importance of these new spatial "modes" of the manipulated array signals, the basis set can be truncated to achieve the sensitivity and acceleration of, for example, a 96-element coil using only a 32-channel scanner.

In accordance with one aspect of the present invention, an RF system is provided that includes a receiver coil array, a preamplifier connected to the receiver coil array, a second gain stage connected the preamplifier, and a mode-mixing apparatus. The mode-mixing apparatus compresses acquired multi-channel MR signals to produce compressed multi-channel MR signals having fewer channels than the first multi-channel MR signals and includes a plurality of splitters, a plurality of combiners, and a plurality of pathways connecting the splitters and combiners so that each combiner receives a pathway from one splitter. Each pathway includes an amplifier and a phase shifter, which may operate under the direction of the MRI system's pulse sequence server or image reconstruction computer. The RF system further includes a receiver that processes and samples the compressed MR signals produced by the mode-mixing apparatus.

The present invention also provides a method for compressing multi-channel magnetic resonance (MR) signals acquired from a subject placed in an MRI system. This method includes performing a prescan in which a plurality of 3D sensitivity profiles of a receiver coil array determined, analyzing the sensitivity profiles of the receiver coils to generate a set of mode-mixing coefficients, and performing a series of pulse sequences with the MRI system to acquire multi-channel MR signals from the subject. The method further includes compressing the acquired multi-channel MR signals with a mode-mixing apparatus, which employs the previously determined mode-mixing coefficients, to produce compressed multi-channel MR signals having fewer channels than the acquired multi-channel MR signals.

Various other features of the present invention will be made apparent from the following detailed description and the drawings.

DETAILED DESCRIPTION OF THE INVENTION

Figure 1:
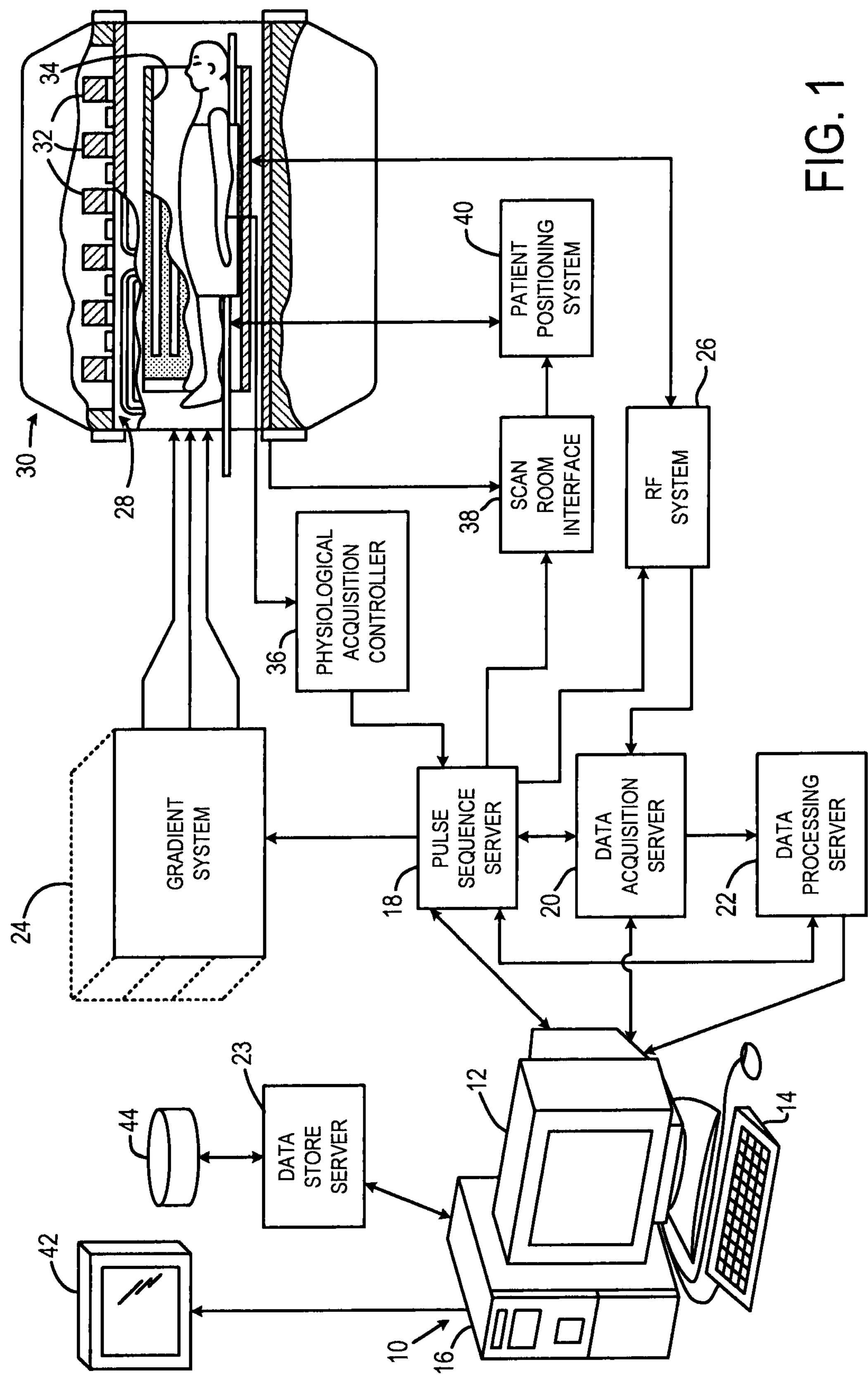
FIG. 1 is a block diagram of an MRI system that employs the present invention.

Referring to FIG. 1, the present invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two- or three-dimensional images, the application of filters to a reconstructed image, the performance of a backprojection image reconstruction of acquired MR data; the calculation of functional MR images, the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
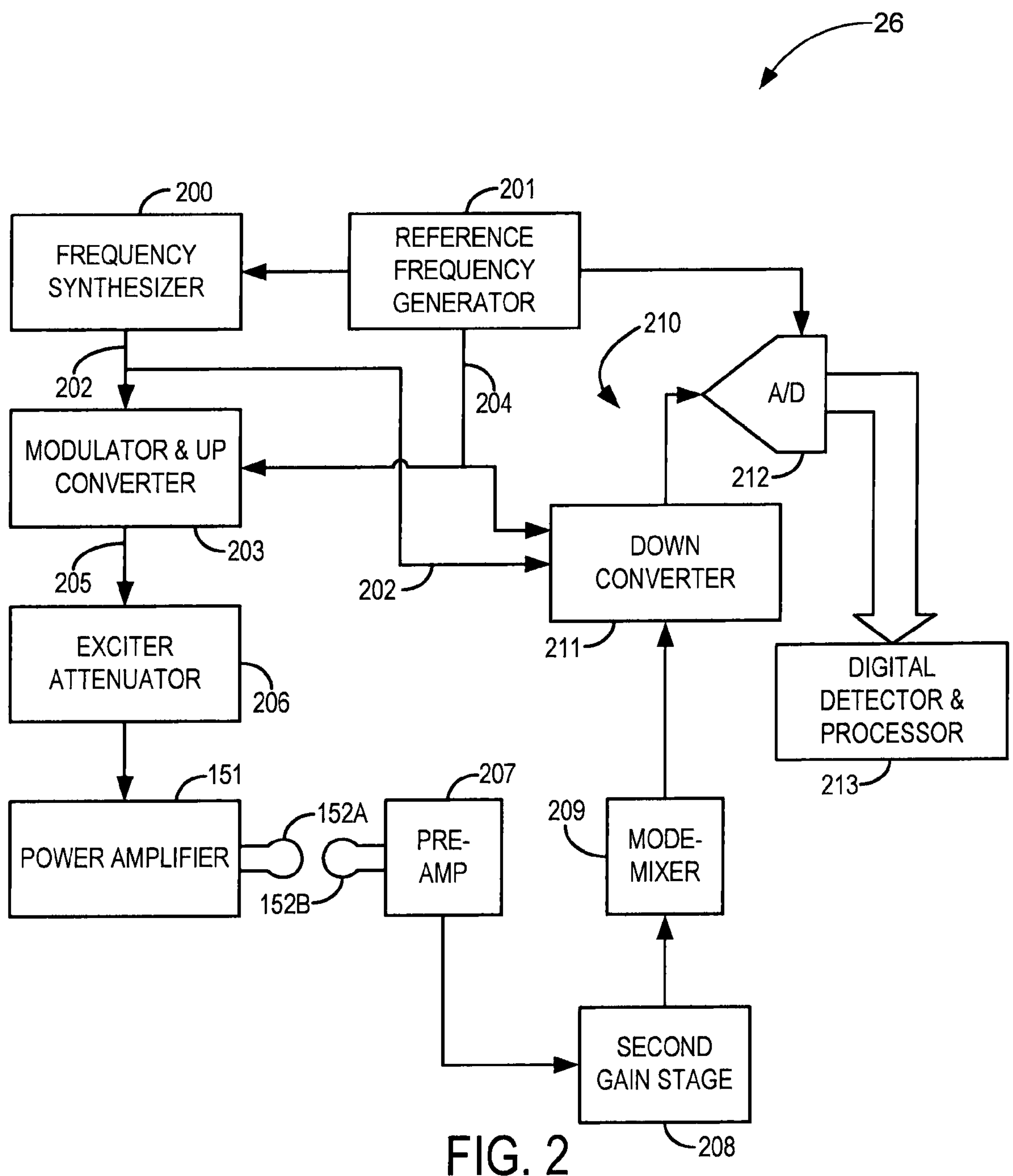
FIG. 2 is a block diagram of an RF system that forms part of the MRI system of FIG. 1.

As shown in FIG. 1, the RF system 26 may be connected to the whole body RF coil 34, or as shown in FIG. 2, a transmitter section of the RF system 26 may connect to one RF coil 152A and its receiver section may connect to a separate RF receive coil 152B. Often, the transmitter section is connected to the whole body RF coil 34 and each receiver section is connected to a separate local coil 152B.

Referring particularly to FIG. 2, the RF system 26 includes a transmitter that produces a prescribed RF excitation field. The base, or carrier, frequency of this RF excitation field is produced under control of a frequency synthesizer 200 that receives a set of digital signals from the pulse sequence server 18 of FIG. 1 and reference signals from the reference frequency generator 201. The digital signals indicate the frequency and phase of the RF carrier signal produced at an output 202. The RF carrier is applied to a modulator and up converter 203 where its amplitude is modulated in response to a signal R(t), which also received from the pulse sequence server 18 of FIG. 1, and a reference signal on line 204. The signal R(t) defines the envelope of the RF excitation pulse to be produced and is produced by sequentially reading out a series of stored digital values. These stored digital values may, be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A.

Referring to FIG. 2 the signal produced by the subject is picked up by the receiver coil 152B, which may include a plurality of coil elements that each output one channel of a multi-channel MR signal. This acquired MR signal may be referred to as being represented by the "coil basis set." Thus, for example, in an array of coil elements, where the individual coils are loop coils, one could refer to the initial signals from each coil element in the array as being conveyed using "loop coil" basis set. It is noted, however, that the coil arrays may take many, many forms other than loops.

The received signal is applied through a preamplifier 207 and a second gain stage 208 to provide a signal amplitude suitable for subsequent processing. The amplified MR signal is fed into a mode-mixer 209, which, as will be described later, compresses the acquired data, for example, compressing a 96-channel input signal to 32-channel output signal. It is contemplated that the mode-mixer 209 operates under the control of other system components, for example, the pulse sequence server 18 of FIG. 1, to provide controlled, application-specific data compression. The output signal of the mode-mixer 209 is applied to a receiver 210 that may include a down converter 211 and an analog-to-digital (A/D) converter 212. The compressed MR signal output by the mode-mixer 209, which is typically at or around the Larmor frequency, is down converted in a two step process by the down converter 211, which first mixes the compressed MR signal with the carrier signal received on line 202 and then mixes the resulting difference signal with a reference signal received on line 204. The down converted MR signal is applied to the input of the A/D converter 212 that samples and digitizes the analog signal and applies it to a digital detector and signal processor 213 that produces 16-bit in-phase (I) values and 16-bit quadrature (Q) values corresponding to the received signal. The resulting stream of digitized I and Q values of the received signal are output to the data acquisition server 20 of FIG. 1. The reference signal as well as the sampling signal applied to the A/D converter 213 are produced by the reference frequency generator 201.

Referring still to FIG. 2, in another configuration, the mode-mixer 209 may be arranged so that it receives an input signal from the down converter 211 and produces an output signal that is sent to the A/D converter 212. While this arrangement allows mode-mixing to be performed at a lower frequency, the down converter 211 receives and processes uncompressed MR data, rather than the compressed MR data produced by the mode-mixer 209.

It is contemplated that additional hardware-based mode mixing strategies may be employed. For example, it is known that mode-mixing strategies employing the Butler matrix may produce orthogonal solutions when array elements are distributed in a single ring on a cylinder, allowing modes with the incorrect circular-polarization to be eliminated. It is therefore contemplated that a 96-element head coil array can be modeled as eight rings of approximately ten loop coils in a ring at a given location along the direction of the principal magnetic field. This provides an efficient method for achieving 50 percent compression, as it allows the 10 channels within each ring of coils to be combined with a 10×10 Butler matrix and truncated to 5 modes by eliminating the resulting anti-CP modes. Further compression may be obtained by feeding the five retained modes, the CP modes, into a small generalized matrix in accordance with the above-described mode-mixing apparatus. Therefore, if 32 modes are desired, this scheme would use eight 10×10 Butler matrices and a 40×32 general matrix.

Figure 3:
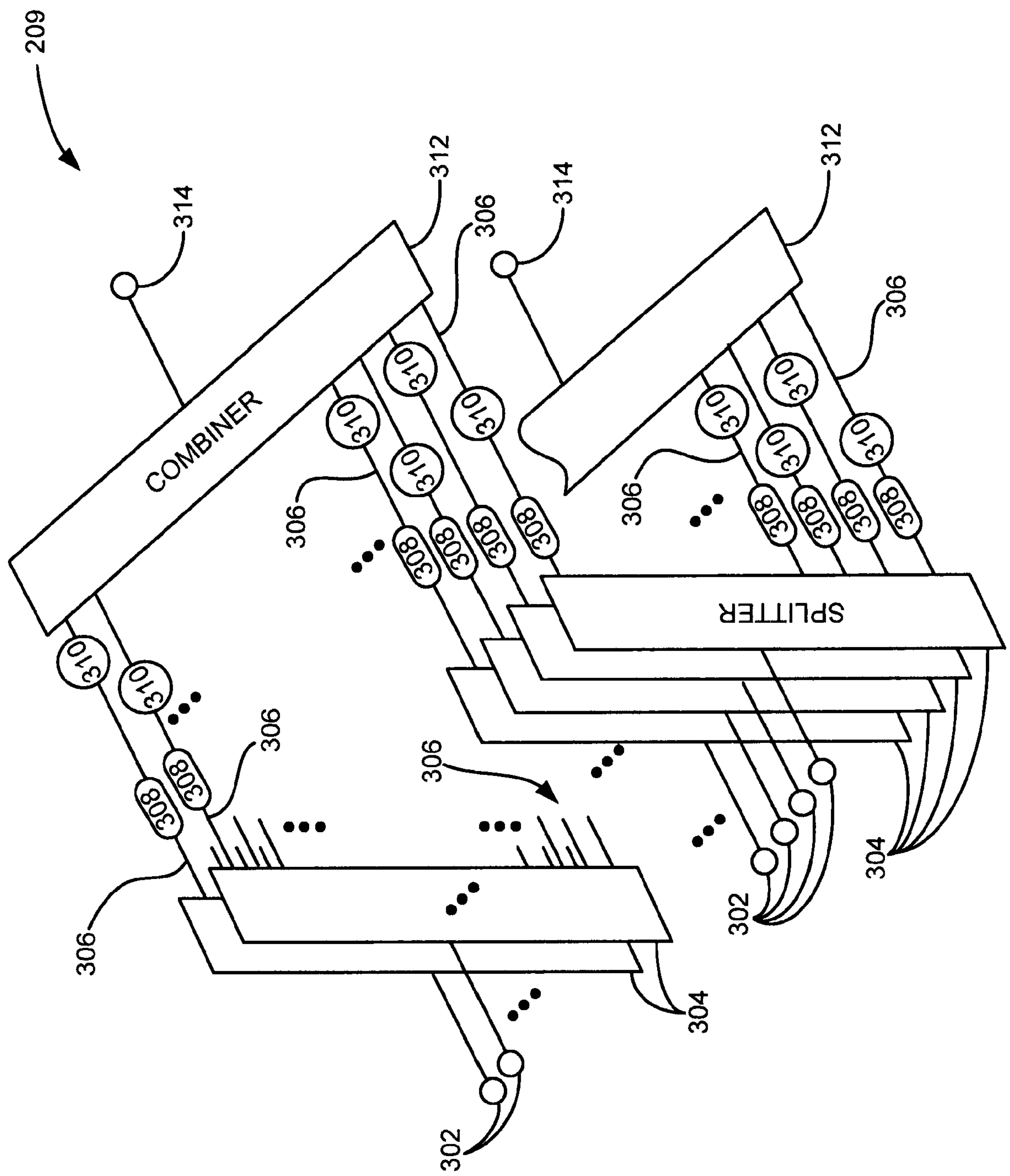
FIG. 3 is a schematic of a mode-mixing apparatus in accordance with the present invention.

Referring particularly to FIG. 3, an exemplary mode-mixing apparatus in accordance with the present invention is shown. Typically, the mode-mixer 209 performs a linear transformation of coil channel data into a new basis set in which the SNR is concentrated in a small subset of basis elements. The mode-mixer 209 includes inputs 302 that receive, via the pre-amp 207 and second stage gain 208 of FIG. 2, MR signals acquired by individual receiver coil elements. Together these signals constitute the input in the coil basis set. The inputs 302 feed into splitters 304 that split each of the acquired signals into a plurality of sub-signals traveling on plurality of pathways 306. Using amplifiers 308 and phase-shifters 310, a gain or attenuation ($a_{ij}$) and a phase shift ($\phi_{ij}$) are imposed on signals traveling through the pathways 306. Each pathway 306 feeds into a combiner 312, which receives one sub-signal from each splitter 304 and produces a "mode" at its output 314. It is therefore contemplated that the number of combiners 312 should equal the number of pathways 306 emanating from an individual splitter 304 and that each combiner should have a number of inputs equaling the total number of splitters 304. It should be noted that, due to space constraints, only a portion of the pathways 306 are shown and a smaller portion are labeled. However, it should be understood that the connections between the splitters 304 and combiners 312 constitute pathways 306.

The modes output by each of the combiners 312 together constitute the signal transformed into the "output basis set" and are described by:

$$m_i = \sum_{j=1}^{N_{coils}} a_{i,j} e^{i\varphi_{i,j}} c_j; \qquad \text{Eqn. 1}$$

where $c_j$ represents the coil signals, $m_i$ is the signal from mode-i formed from the coil signals ($c_j$), i indexes the array modes (1 to $N_{modes}$), and j indexes the coil elements (1 to $N_{coils}$). From equation 1 it is clear that the amplifiers 308 and phase shifters 310 have a significant effect on the linear transformation performed by a mode-mixer. Therefore, parameters weighting the effect of each amplifier 308 and phase shifter 310 in the mode-mixer may be calculated and applied to the mode-mixer 208 of FIG. 2 by the pulse sequence server 18 of FIG. 1. Hence, unlike traditional hardware-based mode mixers, the values or parameters weighting the effect of each amplifier 308 and phase shifter 310 in the mode-mixer of the present invention are adjustable and may be selected by a user or changed for different imaging processes or coils. The calculation of these parameters is discussed hereafter.

In one configuration of the present invention, a mode-mixer is provided to allow the compression of 96-channel coil basis set to a 32-channel output basis set. It is contemplated that this mode-mixer includes 96 inputs and 32-way splitters; 3072 pathways, amplifiers, and phase shifters; and 32 96-way combiners. The mode-mixer enables significant signal compression, but is complicated and includes many components. It is therefore contemplated that connections and components in the mode-mixer may be pruned. In one configuration of the present invention, connections within the mode-mixer having signals that fall below a predefined threshold may be eliminated. For example, eliminating two thirds of the connections would allow the use of 2048 amplifiers and phase shifters and the use of 64-way combiners instead of 96 way combiners. In another configuration of the present invention, a sparsity enforcement algorithm may be employed to choose a subset of modes to be retained and thus reduce hardware complexity.

Figure 4:
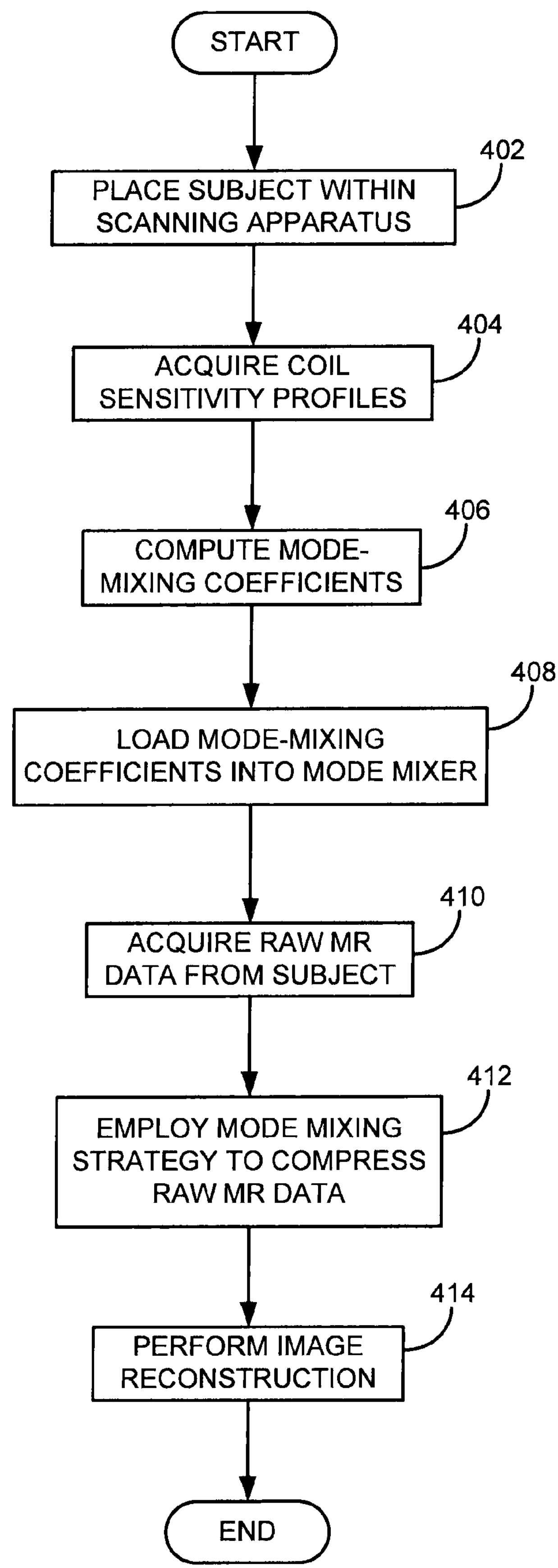
FIG. 4 is flowchart setting forth the steps of calibrating a mode-mixing apparatus in accordance with the present invention.

Referring now to FIG. 4, the determination of parameters controlling the adjustable gain and phase shift applied during mode-mixing begins at process block 402 when a subject is placed within the scanning bore of an MRI system. At process block 404, a prescan is performed to acquire the 3D sensitivity profiles of the receiver coils. It is noted that the prescan can be usilized to collect noise data for noise covariance calculation used in the whitening step, described below.

At process block 406 these sensitivity profiles are analyzed and coefficients controlling the amplifiers 308 and phase shifters 310 are determined. An optimum mode combination in the output basis set should render the sensitivity patterns after transformation by the matrix multiplication orthogonal. In one configuration of the present invention, orthogonality is achieved by rendering the 3D coil sensitivity profile of each coil element as a single vector and using each coil sensitivity vector to form a row of a coil sensitivity matrix (S). A sensitivity correlation matrix R is formed by determining the product of S and its Hermitian conjugate ($S^H$), that is, calculating $R=S\,S^H$. In this case, R is diagonal when the coil profiles are spatially orthogonal, as each element (i, j) of R is the inner product of coil-i with coil-j over space. The linear transformation of the coil basis set into a new basis set spatially orthogonal coil profiles is derived by diagonalizing R using the eigenvector decomposition, $R=U\,D\,U^{-1}$, where, D denotes a diagonal matrix containing eigenvalues and U denotes the corresponding eigenvectors of R. The eigenvectors in U are then sorted by their corresponding eigenvalues in D so that the eigenvectors are ordered according to their influence in the new basis set. The matrices U and D are then truncated to eliminate eigenbasis elements that contribute little to the SNR of the new basis set.

It should be noted that, because the squares of the singular values of S are the eigenvalues of R, the eigenbasis can be computed directly from S using singular value decomposition (SVD) and, because R is normal, that is, $R^H\,R=R\,R^H$, its eigen-decomposition and SVD are equivalent. Furthermore, improved mode-compression performance may be achieved by incorporating information regarding the noise observed by the coil array into the calculation of the eigenvalues and eigenvectors. This may be achieved using a $N_{coils}$ by $N_{coils}$ noise covariance matrix ($\Psi$), which may be combined with the signal measurements by transforming the original coil sensitivity profiles into an intermediate coordinate system in which the noise is decorrelated through a whitening transformation. The noise decorrelation matrix (W), which is defined by $W^H\,W=\Psi^{-1}$ and may be computed using the Cholesky decomposition or the SVD, is used to produce a whitened sensitivity matrix $\tilde{S}=W\,S$ and, subsequently, a whitened signal correlation matrix $\tilde{R}=\tilde{S}\,S^H$. The eigenbasis is then calculated for the whitened signal correlation matrix, that is, $\tilde{R}=\tilde{U}\,\tilde{D}\,\tilde{U}^{-1}$.

Referring still to FIG. 4, at process block 408, the retained eigenvectors constitute the mode-mixing coefficients, which are loaded into the mode-mixer 208 of FIG. 2 by the pulse sequence server 18 of FIG. 1. In this case, the magnitudes of the calculated eigenvectors are loaded to control the amplifiers 308 of FIG. 3 and the phases of the calculated eigenvectors are loaded to control the phase shifters 310. Referring again to FIG. 4, at process block 410, an MRI scan is performed to acquire raw MR data from a subject. This multi-channel MR data forms the coil basis set that, at process block 412, is processed by the mode-mixer using the coefficients generated at process block 406 to generate a compressed output basis set having fewer channels than the coil basis set. At process block 414, the MR data in the output basis set is reconstructed to produce MR images of a subject.

Thus, in light of the foregoing, it should be noted that the present invention advantageously provides a system and method for truncating the basis set by discarding some of the modes; thus, reducing the number of RF receiver channels as well as computational and data pipeline bottlenecks. Although both basis sets contain the same information, forming combinations, for example, linear combinations, of array elements can transform the spatial modes of the array into a different basis set, potentially capturing a majority of the reception efficiency and acceleration capabilities in a small subset of the modes. The available receive channels can then be applied only to a subset of array modes, which are chosen based on their contribution to receive efficiency and encoding. A key point is that both complete basis sets may have equal information, but the information can be divided unequally among the modes. In this case, omitting the "empty" modes has little penalty in sensitivity or acceleration capability.

Therefore, the present invention provides a generalized mode mixing system and method that can be applied to any size or configuration of an RF coil. General matrixes can be configured where the gain and phase shift in each connection within the matrix can be set differently, for a given coil array or application.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

The invention claimed is:

1. A magnetic resonance imaging (MRI) system comprising:

a computer system configured to operate the MRI system during an imaging process in order to image a subject;

an RF system including a receive coil array having a first number of channels configured to acquire signals from the subject during the imaging process;

a mode-mixing apparatus configured to receive the signals acquired by the receive coil array in order to form a coil basis set having the first number of channels and the mode-mixing apparatus comprising:

a plurality of splitters configured to receive the formed coil basis set and produce a plurality of sub-signals;

a plurality of amplifiers configured to adjust the respective sub-signals by a respective adjustable amplification value within a range of non-fixed values;

a plurality of phase shifters configured to phase shift the respective sub-signals by a respective adjustable phase-shift value within a range of non-fixed values;

a plurality of combiners configured to receive the plurality of amplified and phase shifted sub-signals and produce an output basis set having a second number of channels; and an input configured to receive a selection of at least one of the adjustable respective amplification value and the adjustable respective phase-shift value within a range of non-fixed values.

2. The MRI system of claim 1 wherein the second number of channels is less than the first number of channels.

3. The MRI system of claim 1 wherein the computer system provides a user input configured to receive a user selection of the at least one of the adjustable respective amplification value and the adjustable respective phase-shift value; and wherein the computer system is configured to provide the adjustable respective amplification value and the adjustable respective phase-shift value to the plurality of amplifiers and plurality of phase shifters.

4. The MRI system of claim 3 wherein the computer system is configured to select and communicate to the input the adjustable respective amplification value and the adjustable respective phase-shift value based on at least one of a plurality of coil sensitivity profiles of a receive coil being used with the MRI system and a matrix decomposition analysis.

5. The MRI system of claim 1 wherein the computer is configured to acquire coil sensitivity data during the imaging process and generate a coil sensitivity matrix using the coil sensitivity data; and wherein the computer is further configured to generate a signal correlation matrix by matrix-multiplying the coil sensitivity matrix with the coil sensitivity matrix's Hermitian conjugate.

6. The MRI system of claim 5 wherein the computer system is configured to select and communicate to the input the adjustable respective amplification value and the adjustable respective phase-shift value using an eigenvector matrix and corresponding eigenvalues determined by performing matrix decomposition on the signal correlation matrix.

7. The MRI system of claim 6 wherein the computer system is configured to store the adjustable respective amplification value as a magnitude of an eigenvector matrix and the adjustable respective phase-shift value as the phase of an eigenvector matrix.

8. The MRI system of claim 7 wherein the eigenvalue matrix and the eigenvector matrix include information regarding noise covariances in the coil basis set.

9. The MRI system of claim 5 wherein the signal correlation matrix is a whitened signal correlation matrix generated by matrix-multiplying a whitened coil sensitivity matrix with the whitened coil sensitivity matrix's Hermitian conjugate.

10. The MRI system of claim 1 wherein the first number of channels is 96, the second number of channels is 32, the plurality of splitters includes 96 32-way splitters, the plurality of combiners includes 32 96-way combiners, the plurality of amplifiers includes 3072 amplifiers, and the plurality of phase shifters includes 3072 phase shifters.

11. A method of calibrating a mode-mixing apparatus including a plurality of hardware-based amplifiers and phase shifters for use in a magnetic resonance imaging (MRI) system, the steps comprising:

a) performing a prescan in order to determine a plurality of sensitivity profiles of a receiver coil array;

b) analyzing the sensitivity profiles of the receiver coils in order to generate a set of mode-mixing coefficients;

c) generating a report of the set of mode-mixing coefficients; and d) loading the report of the set of mode-mixing coefficients in the mode-mixing apparatus in order to select a value of amplification at each of the plurality of hardware-based amplifiers and a value of phase shift at each of the plurality of hardware-based phase shifters.

12. The method of claim 11 further including:

b) i) calculating a signal correlation matrix;

b) ii) calculating an eigenvalue matrix and an eigenvector matrix from the signal correlation matrix;

b) iii) truncating the eigenvalue matrix and the eigenvector matrix; and wherein the truncated eigenvalue matrix selects the value of amplification at each of the plurality of hardware-based amplifiers and the truncated eigenvector matrix selects the value of phase shift at each of the plurality of hardware-based phase shifters.

13. The method of claim 12 wherein the eigenvector matrix and corresponding eigenvalues are determined by performing matrix decomposition on a signal correlation matrix.

14. The method of claim 12 wherein the signal correlation matrix is generated by matrix-multiplying a coil sensitivity matrix with the coil sensitivity matrix's Hermitian conjugate.

15. The method of claim 12 wherein the eigenvalue matrix and the eigenvector matrix include information regarding noise covariances in the coil basis set.

16. The method of claim 12 wherein the signal correlation matrix is a whitened signal correlation matrix generated by matrix-multiplying a whitened coil sensitivity matrix with the whitened coil sensitivity matrix's Hermitian conjugate.

17. The method of claim 16 wherein step a) includes collecting noise data and step b) includes calculating a noise covariance for use with the whitened signal correlation matrix.

18. A mode-mixing apparatus configured for use in a magnetic resonance imaging (MRI) system in order to receive and process a coil basis set having a first number of channels, the mode-mixing apparatus comprising:

a plurality of splitters configured to receive the coil basis set and produce a plurality of sub-signals;

a plurality of amplifiers configured to adjust the respective sub-signals by a respective adjustable amplification value based on the plurality of selected adjustable amplification values;

a plurality of phase shifters configured to phase shift the respective sub-signals by a respective adjustable phase-shift value based on the plurality of selected adjustable phase-shift values; and a plurality of combiners configured to receive the plurality of amplified and phase shifted sub-signals and produce an output basis set having a second number of channels that is less than the first number of channels of the coil basis set.

19. The apparatus of claim 18 wherein the plurality of selected adjustable amplification values and the plurality of phase-shift values are received from a user input.

20. The apparatus of claim 18 wherein the plurality of amplifiers and plurality of phase shifters are configured to receive the adjustable respective amplification value and the adjustable respective phase-shift value from a pulse sequence server of the MRI system.

21. The apparatus of claim 20 wherein the adjustable respective amplification value and the adjustable respective phase-shift value are selected by the pulse sequence server of the MRI system based on at least one of a plurality of coil sensitivity profiles of a receive coil being used with the MRI system and a matrix decomposition analysis.

* * * * *

UNITED STATES PATENT AND TRADEMARK OFFICE

CERTIFICATE OF CORRECTION

PATENT NO. : 8,581,589 B2
APPLICATION NO. : 12/698864
DATED : November 12, 2013
INVENTOR(S) : Lawrence L. Wald et al.

It is certified that error appears in the above-identified patent and that said Letters Patent is hereby corrected as shown below:

In the Specification

Column 1, Line 31: "presses" should be -- precess --

Column 9, Line 65: " $(\phi_{ij})$ " should be -- $(\varphi_{ij})$ --

Signed and Sealed this
Fourteenth Day of January, 2014

Michelle K. Lee
*Deputy Director of the United States Patent and Trademark Office*